(12) United States Patent
Kong et al.

(10) Patent No.: US 6,703,323 B2
(45) Date of Patent: Mar. 9, 2004

(54) METHOD OF INHIBITING PATTERN COLLAPSE USING A RELACS MATERIAL

(75) Inventors: Keun Kyu Kong, Kyongki-do (KR); Sung Koo Lee, Seoul (KR)

(73) Assignee: Hynix Semiconductor INC, Kyoungki-Do (KR)

( * ) Notice: Subject to any disclaimer, the term of this patent is extended or adjusted under 35 U.S.C. 154(b) by 18 days.

(21) Appl. No.: 10/319,059

(22) Filed: Dec. 13, 2002

(65) Prior Publication Data

US 2003/0143489 A1 Jul. 31, 2003

(30) Foreign Application Priority Data

Dec. 14, 2001 (KR) .......................... 2001-79351

(51) Int. Cl.[7] .............................................. H01L 21/31
(52) U.S. Cl. ...................... 438/780; 438/781; 430/312
(58) Field of Search ................. 438/780, 781, 438/725; 430/312

(56) References Cited

U.S. PATENT DOCUMENTS 6,383,952 B1 * 5/2002 Subramanian et al. ...... 438/781
6,465,161 B1 * 10/2002 Kang et al. .................. 430/327
6,537,727 B2 * 3/2003 Yoon et al. ............... 430/270.1

FOREIGN PATENT DOCUMENTS

JP    2000228503    8/2000

* cited by examiner

*Primary Examiner*—Douglas A. Wille
(74) *Attorney, Agent, or Firm*—Marshall, Gerstein & Borun LLP

(57) ABSTRACT

A method of inhibiting pattern collapse using relacs (resist enhancement lithography assisted by chemical shrink) is disclosed herein. More particularly, the present invention relates to a method of forming photoresist patterns by coating relacs material on an underlying layer before coating photoresist material thereon and then heating the layer to inhibit pattern collapse.

7 Claims, 4 Drawing Sheets

METHOD OF INHIBITING PATTERN COLLAPSE USING A RELACS MATERIAL

BACKGROUND

1. Technical Field

A method of inhibiting patterns collapse by using a relacs (resist enhancement lithography assisted by chemical shrink) material is disclosed. More particularly, a method of forming photoresist patterns is disclosed that includes coating a relacs material on an underlying layer before coating photoresist material thereon and then heating the layer to inhibit pattern collapse.

2. Description of the Related Art

As semiconductor devices become more minute, thickness of photoresist to be coated becomes thinner. Due to the thinner thickness of photoresist, an underlying layer is not removed effectively during etching process. As a result, it is impossible to form a circuit.

A new etching process may be developed or a hard mask process may be additionally introduced to overcome the above problem. However, those processes cause the unit cost of production to increase and the pattern to have a higher aspect ratio (thickness of photoresist, height/linewidth of formed pattern), thereby resulting collapsing patterns.

After as photoresist patterns are formed using general lithography process, a process of cleaning semiconductor substrate is performed by spraying deionized water from a top portion of spin device with the semiconductor substrate spinning. During this process, high surface tension of deionized water results in pattern collapse.

In order to overcome the problem of pattern collapse, additives or surfactants may be added in the deionized water to decrease the surface tension of the deionized water.

Many attempts are made to improve adhesive force of photoresist on substrates, but obvious results have not been obtained therefrom.

Photoresist patterns collapse when the height of photoresist patterns goes beyond critical height and then the capillary force exceeds elasticity in photoresist (see FIG. 4).

Accordingly, there is a need to increase the elasticity of photoresist or decrease the surface tension of the photoresist result by increasing the adhesive force between the underlying layers and the photoresist, thereby preventing or reducing pattern collapse.

SUMMARY OF THE DISCLOSURE

In satisfaction of the aforenoted need, a method for inhibiting photoresist pattern collapse using a relacs material is disclosed.

DETAILED DESCRIPTION OF THE PRESENTLY PREFERRED EMBODIMENTS

A method of forming photoresist patterns by coating a relacs material on an underlying layer before coating photoresist material thereon and then heating the layer to inhibit patterns collapse is disclosed.

The relacs material means a compound or a composition which is subject to cross-linking reaction with each one of bottom antireflective coating (herein after, referred to as "BARC") film and photoresist film at the presence of acid. The relacs material is commercialized by Clariant Co., which is for use of reducing the size of contact hole (Laura J. Peters, "Resist Join the Sub-λ Revolution", *Semiconductor International*, September 1999; Toshiyuki Toyoshima, "0.1 μm Level contact hole pattern formation with KrF lithography by Resist Enhancement Lithography Assisted by Chemical Shrink", IEEE, 1998). The present invention intends to improve etching characteristics of photoresist pattern by using the relacs material.

There is provided a method of forming patterns having cross linkage on interfaces of photoresist films and relacs material, comprising:

(a) coating a bottom antireflective coating film on an underlying layer;

(b) coating relacs material on the bottom antireflective coating film;

(c) forming and heating a photoresist film on the relacs material; and (d) selectively exposing and developing the photoresist film Details of the present disclosure will be described below with reference to the drawings.

Figure 1:
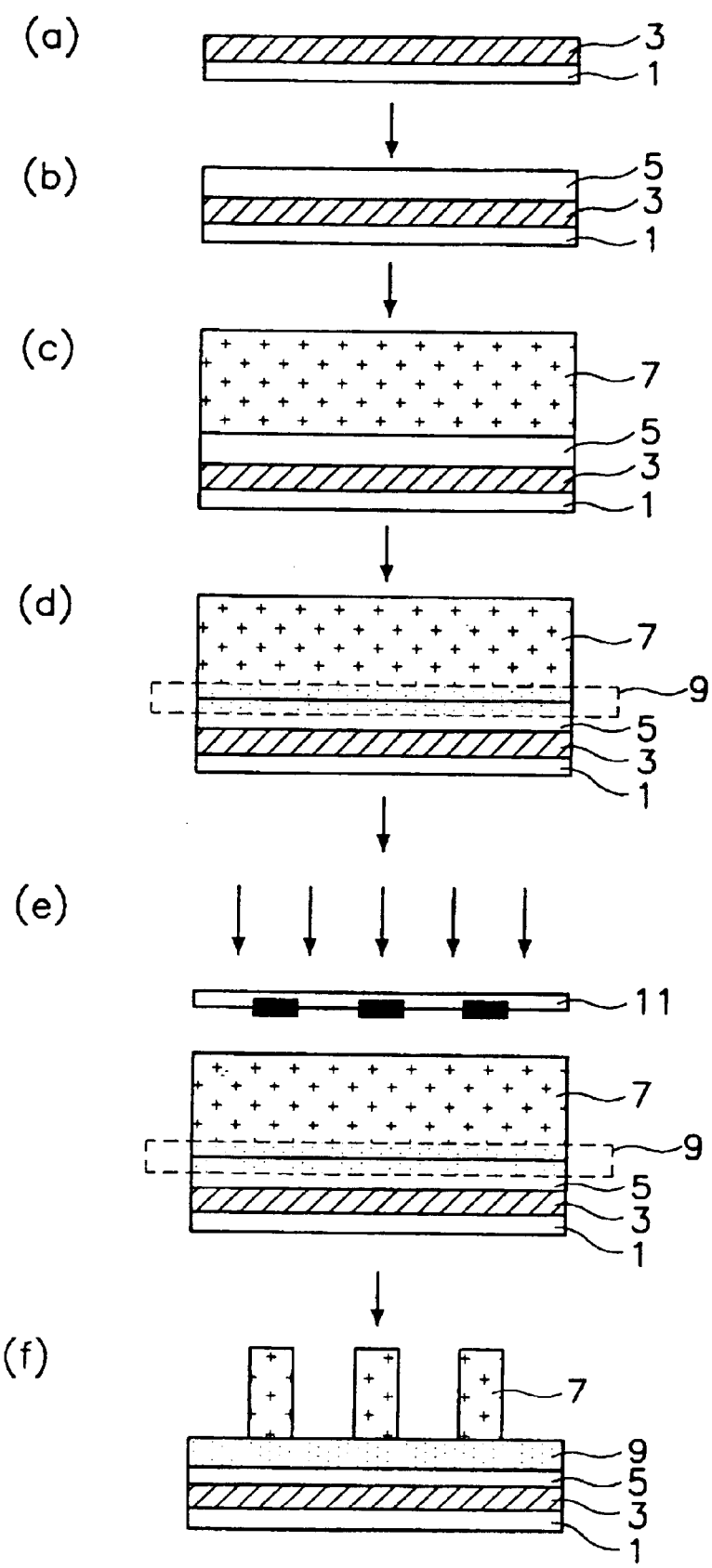
FIG. 1 is a diagram illustrating a process of the present invention.

Referring to FIG. 1(a), the BARC film 3 is coated on an underlying layer 1.

Referring to FIG. 1(b), the relacs material 5 is coated on the BARC film 3.

Referring to FIG. 1(c), the photoresist material 7 is coated on the relacs material 5.

Here, it is preferable that thickness of the relacs material ranges from about 200 to about 600 Å and thickness of the photoresist material ranges from about 2400 to about 2500 Å.

Referring to FIG. 1(d), the photoresist material 7 is coated on the relacs material 5 and then heated, the acid generated from BARC film 3 is diffused into the relacs material. As a result, a cross-linking reaction rises on a portion 9 whereon the relacs material 5 and the photoresist material 7 are contacted.

Referring to FIGS. 1(e) through 1(f), After exposing process using mask 11, this cross linkage effectively inhibits pattern collapse during a developing process.

The mechanism of cross-linking reaction is as follows. The acid is generated from thermal oxidation generator included in BARC by heating, thus resulting in cross-linking reaction in BARC. While the acid is diffused into relacs material, the cross-linking reaction rises between BARC and relacs material. While the acid diffused into the relacs material is re-diffused into photoresist material, the cross-linking reaction also rises between the relacs material and photoresist material. As a result, BARC, relacs material and photoresist material coated on underlying layers are solidly fixed due to the cross-linking reaction.

In the step (c), it is preferable that heating temperature ranges from 150 to 250° C.

Photoresist materials for KrF, ArF, and VUV may be used for forming the photoresist film.

The photoresist polymer used in the photoresist film is selected from the group consisting of: (i) an acrylate polymer; (ii) a cycloolefin-maleic anhydride copolymer (COMA type polymer); and (iii) mixtures thereof.

Here it is preferable that the COMA type polymer, solution inhibitor, includes at least one repeating unit of the following Formulas 1 to 2:

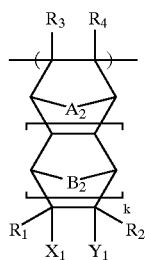

Formula 1

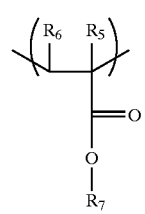

Formula 2 wherein $A_2$ and $B_2$ individually are $CH_2$, $CH_2CH_2$, oxygen or sulfur;

$X_1$, $Y_1$, $R_1$ and $R_2$ are individually selected from the group consisting of a hydrogen, a substituted linear or branched $C_1$–$C_{10}$ alkyl, a substituted linear or branched $C_1$–$C_{10}$ ester, a substituted linear or branched $C_1$–$C_{10}$ ketone, a substituted linear or branched $C_1$–$C_{10}$ carboxylic acid, and a substituted linear or branched $C_1$–$C_{10}$ acetal, at least one of $X_1$ and $Y_1$ are an acid labile protecting group;

$R_3$, $R_4$, $R_5$ and $R_6$ individually are hydrogen or $CH_3$;

$R_7$ is an acid labile protecting group; and k is an integer ranging from 0 to 5.

The exposing source of the exposing process is selected from the group consisting of KrF, ArF, VUV, EUV, E-beam, X-ray and ion-beam.

There is also provided a semiconductor device fabricated using the method according to the present invention.

The disclosed method of inhibiting pattern collapse using relacs material will be described in more details referring to examples below, when are not intended to be limiting.

EXAMPLE 1

Formation of Fine Patterns Using Relacs Material (1)

Figure 2:
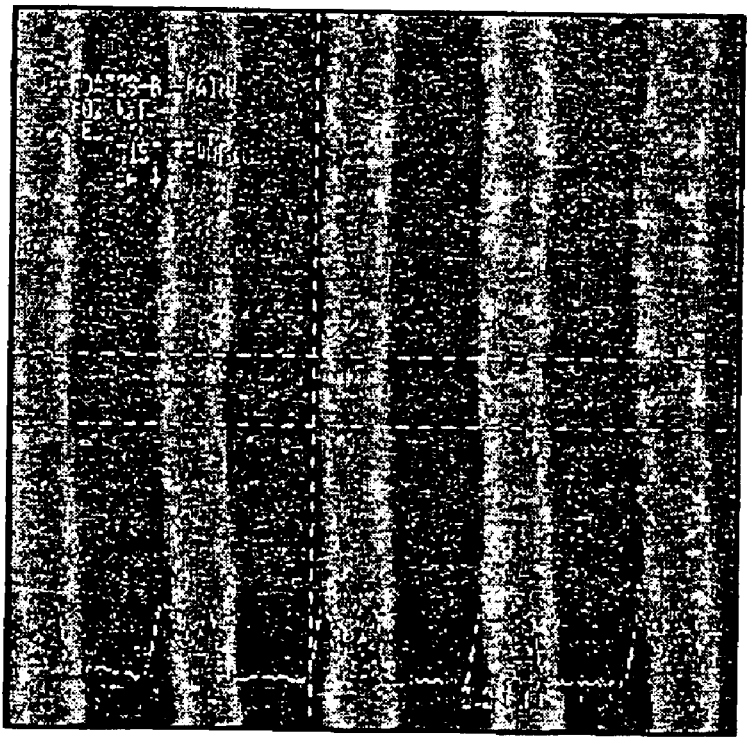
FIG. 2 is a pattern obtained from Example 1.

After a BARC film was coated on a wafer at 390 Å, a relacs material was coated on the BARC film at 300 Å. ArF photoresist of methacrylate group, AX1020P produced by Clariant Co., was coated at 2800 Å, heated at 120° C./60 s, and then exposed using ArF exposing device. After exposure, the ArF photoresist was re-heated at 120° C./90 s and developed, to obtain 100 nm L/S pattern without collapse (see FIG. 2).

EXAMPLE 2

Formation of Fine Patterns Using Relacs Material (2)

Figure 3:
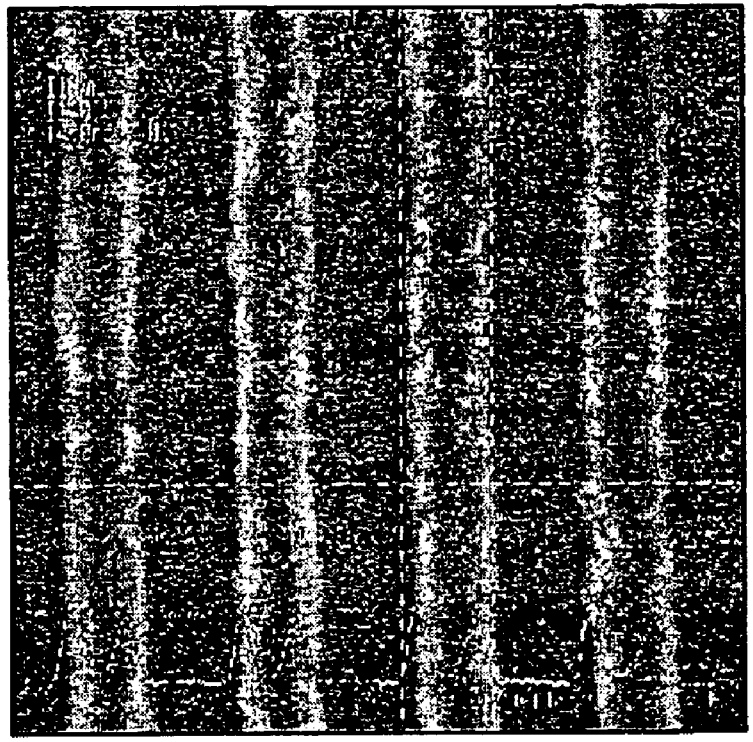
FIG. 3 is a pattern obtained from Example 2.

The procedure of Example 1 was repeated but coating relacs material at 200 Å and photoresist at 3500 Å, to obtain 100 nm L/S pattern without collapse (see FIG. 3).

COMPARATIVE EXAMPLE 1.

Figure 4:
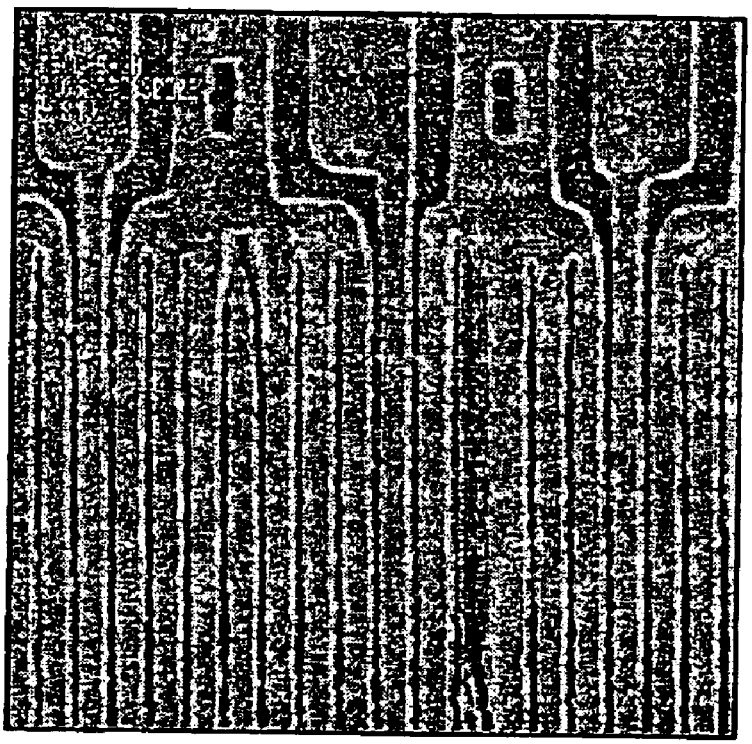
FIG. 4 is a pattern obtained from Comparative Example.

The procedure of Example 1 was repeated without coating relacs material. As a result, the photoresist pattern was collapsed (see FIG. 4).

As discussed earlier, the disclosed method may effectively inhibit pattern collapse during developing process due to cross-linking reaction between relacs material and photoresist. As a result, aspect ratio of patterns increases, thereby contributing to high integration of devices.

What is claimed is:

1. A method of forming photoresist patterns comprising:

(a) coating a bottom antireflective coating film on an underlying layer;

(b) coating relacs material on the bottom antireflective coating film;

(c) forming and heating a photoresist film on the relacs material; and (d) selectively exposing and developing the photoresist film.

2. The method according to claim 1, wherein the heating temperature of the (c) step ranges from 150 to 250° C.

3. The method according to claim 1, wherein the photoresist polymer used in the photoresist film is selected from the group consisting of an acrylate polymer, a cycloolefin-maleic anhydride copolymer (COMA type polymer), and mixtures thereof.

4. The method according to claim 3, wherein the COMA type polymer includes at least one repeating unit of the following Formulas 1 to 2:

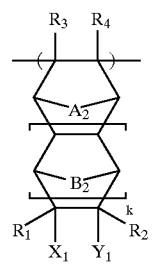

Formula 1

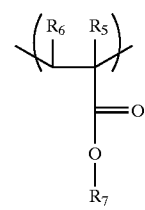

Formula 2 wherein $A_2$ and $B_2$ individually are $CH_2$, $CH_2CH_2$, oxygen or sulfur;

$X_1$, $Y_1$, $R_1$ and $R_2$ are individually selected from the group consisting of a hydrogen, a substituted linear or branched $C_1$–$C_{10}$ alkyl, a substituted linear or branched $C_1$–$C_{10}$ ester, a substituted linear or branched $C_1$–$C_{10}$ ketone, a substituted linear or branched $C_1$–$C_{10}$ carboxylic acid, and a substituted linear or branched $C_1$–$C_{10}$ acetal, at least one of $X_1$ and $Y_1$ are an acid labile protecting group;

$R_3$, $R_4$, $R_5$ and $R_6$ individually are hydrogen or $CH_3$;

$R_7$ is an acid labile protecting group; and k is an integer ranging from 0 to 5.

5. The method according to claim 1, wherein the exposing source of the exposing step is selected from the group consisting of KrF, ArF, VUV, EUV, E-beam, X-ray and ion-beam.

6. The method according to claim 1, wherein the relacs material is a material which is subject to cross-linking reaction with each one of the bottom antireflective coating film and the photoresist film at the presence of acid.

7. A semiconductor device fabricated using the method of claim 1.

* * * * *

UNITED STATES PATENT AND TRADEMARK OFFICE
CERTIFICATE OF CORRECTION

PATENT NO. : 6,703,323 B2
DATED : March 9, 2004
INVENTOR(S) : Kong et al.

It is certified that error appears in the above-identified patent and that said Letters Patent is hereby corrected as shown below:

<u>Title page,</u>
Item [75], Inventors, after "Keun Kyu Kong," please delete "Kyonki-do" and insert -- Kyoungki-do -- in its place.

Signed and Sealed this

Eighth Day of March, 2005

JON W. DUDAS
*Director of the United States Patent and Trademark Office*